(12) United States Patent
Cox et al.

(10) Patent No.: US 6,445,257 B1
(45) Date of Patent: Sep. 3, 2002

(54) FUSE-TRIMMED TANK CIRCUIT FOR AN INTEGRATED VOLTAGE-CONTROLLED OSCILLATOR

(75) Inventors: Robert Cox, Little Abington; Gwilym Luff, Great Shelford, both of (GB)

(73) Assignee: Micro Linear Corporation, San Jose, CA (US)

( * ) Notice: Subject to any disclaimer, the term of this patent is extended or adjusted under 35 U.S.C. 154(b) by 0 days.

(21) Appl. No.: 09/680,396

(22) Filed: Oct. 4, 2000

Related U.S. Application Data (60) Provisional application No. 60/167,194, filed on Nov. 23, 1999.

(51) Int. Cl.[7] ................................................ H03B 5/12
(52) U.S. Cl. ........................ 331/117 R; 331/177 V; 331/179
(58) Field of Search ................ 331/36 C, 116 R, 331/116 FE, 117 R, 117 FE, 117 D, 177 V, 179

(56) References Cited

U.S. PATENT DOCUMENTS

| | | | | |
|---|---|---|---|---|
| 3,700,924 A | * | 10/1972 | Fulkerson | .................... 307/255 |
| 4,141,209 A | | 2/1979 | Barnett et al. | ............... 58/23 A |

(List continued on next page.)

FOREIGN PATENT DOCUMENTS

| | | | | |
|---|---|---|---|---|
| EP | 0 344 852 A1 | 12/1989 | ............ | H03H/11/04 |
| EP | 0 584 870 A1 | 8/1993 | ............ | H03D/7/14 |
| EP | 0 576 082 A1 | 12/1993 | ............ | H04B/1/26 |
| EP | 0 660 504 A1 | 6/1995 | ............ | H03B/5/12 |
| EP | 0 723 335 A1 | 7/1996 | ............ | H03J/7/02 |
| EP | 0 833 482 A2 | 1/1998 | ......... | H04L/27/233 |
| EP | 0 853 374 A1 | 7/1998 | ............ | H03D/7/14 |
| EP | 0 948 129 A1 | 10/1999 | ............ | H03D/7/18 |
| GB | 2330 279 A | 4/1999 | ........... | H04L/27/14 |

OTHER PUBLICATIONS

Hidehiko Kuroda et al., "Development of Low–Power Consumption RF/IF Single–Chip Transceiver IC for PHS," Doc. No. XP–000832839, pp. 161–167, Compound Semiconductor Device Division, NEC IC Microcomputer Systems, Ltd., 4/98.

Angel Boveda et al., "GaAs Monolithic Single–Chip Transceiver," Doc. No. XP–000538492, pp. 31–34, IEEE, May 15, 1995.

*Primary Examiner*—David Mis
(74) *Attorney, Agent, or Firm*—Haverstock & Owens LLP (57) ABSTRACT

A fuse-trimmed tank circuit for an integrated voltage-controlled oscillator (VCO). The tank circuit includes an L-C portion; a cross-coupled pair of transistors, whose collectors are coupled to the L-C portion; a capacitor coupled across the emitters of the cross-coupled pair of transistors; and a pair of resistors, where each resistor is coupled between a corresponding one of the emitters and a ground node. This oscillator circuit provides improved performance over prior oscillator circuits. A technique for trimming the VCO is utilized to adjust its center frequency. Capacitance for the L-C portion of the tank circuit is provided by one or more varactor diodes. When the VCO is operational, the varactors are reverse biased and, thus, act as capacitive elements. One or more of the varactors has an associated fuse coupled in series with the corresponding varactor. To trim the center frequency of the VCO, the capacitance of the L-C portion is adjusted by selectively blowing the fuses. To blow a fuse, a dc voltage is applied to forward bias the corresponding varactor such that the resulting current is sufficiently high to blow the fused. In the preferred embodiment, the varactors are arranged in pairs, where each varactor of the contributes to the capacitance of one or the other sides of the tank circuit for maintaining its symmetry. The two fuses associated with each varactor of the pair are preferably blown together. Preferably, the VCO is integrated into an integrated circuit.

50 Claims, 3 Drawing Sheets

U.S. PATENT DOCUMENTS

| | | | |
|---|---|---|---|
| 4,350,957 A | 9/1982 | Miyamoto | 329/107 |
| 4,723,318 A | 2/1988 | Marshall | 455/109 |
| 4,823,092 A | 4/1989 | Pennock | 330/253 |
| 4,918,338 A | 4/1990 | Wong | 307/521 |
| 5,182,477 A | 1/1993 | Yamasaki et al. | 307/494 |
| 5,245,565 A | 9/1993 | Petersen et al. | 364/825 |
| 5,303,420 A | 4/1994 | Jang | 455/343 |
| 5,345,190 A | 9/1994 | Kaylor | 330/258 |
| 5,353,307 A | 10/1994 | Lester et al. | 375/14 |
| 5,379,457 A | 1/1995 | Nguyen | 455/323 |
| 5,491,447 A | 2/1996 | Goetschel et al. | 330/254 |
| 5,497,123 A | 3/1996 | Main et al. | 330/257 |
| 5,680,072 A | 10/1997 | Vulih et al. | 327/554 |
| 5,714,915 A * | 2/1998 | Brilka | 331/117 R |
| 5,734,294 A | 3/1998 | Bezzam et al. | 327/552 |
| 5,739,730 A * | 4/1998 | Rotzoll | 331/177 V |
| 5,886,547 A | 3/1999 | Durec et al. | 327/113 |
| 5,936,474 A | 8/1999 | Rousselin | 331/34 |
| 6,060,935 A | 5/2000 | Shulman | 327/345 |

* cited by examiner

FUSE-TRIMMED TANK CIRCUIT FOR AN INTEGRATED VOLTAGE-CONTROLLED OSCILLATOR

RELATED APPLICATIONS

This application claims priority under 35 U.S.C. §119(e) of the co-pending U.S. provisional application Serial No. 60/167,194 filed on Nov. 23, 1999 and entitled "FUSE-TRIMMED TANK CIRCUIT FOR AN INTEGRATED VOLTAGE-CONTROLLED OSCILLATOR." The provisional application Serial No. 60/167,194 filed on Nov. 23, 1999 and entitled "FUSE-TRIMMED TANK CIRCUIT FOR AN INTEGRATED VOLTAGE CONTROLLED OSCILLATOR" is also hereby incorporated by reference.

FIELD OF THE INVENTION

The present invention relates to voltage-controlled oscillators. More particularly, the present invention relates to a fuse-trimmed tank circuit for an integrated voltage-controlled oscillator.

BACKGROUND OF THE INVENTION

A voltage-controlled oscillator (VCO) is an electronic device which provides a periodic signal where the frequency of the periodic signal is related to the level of an input voltage control signal supplied to the VCO. There are numerous applications for VCOs, including modulating and demodulating radio frequency communication signals, such as in a radio frequency transceiver. A VCO typically includes a resonant tank circuit which resonates so as to form the periodic signal. A conventional resonant tank circuit used in an integrated VCO includes a parallel combination of an inductor and a capacitor along with a cross-coupled transistor pair.

Figure 1:
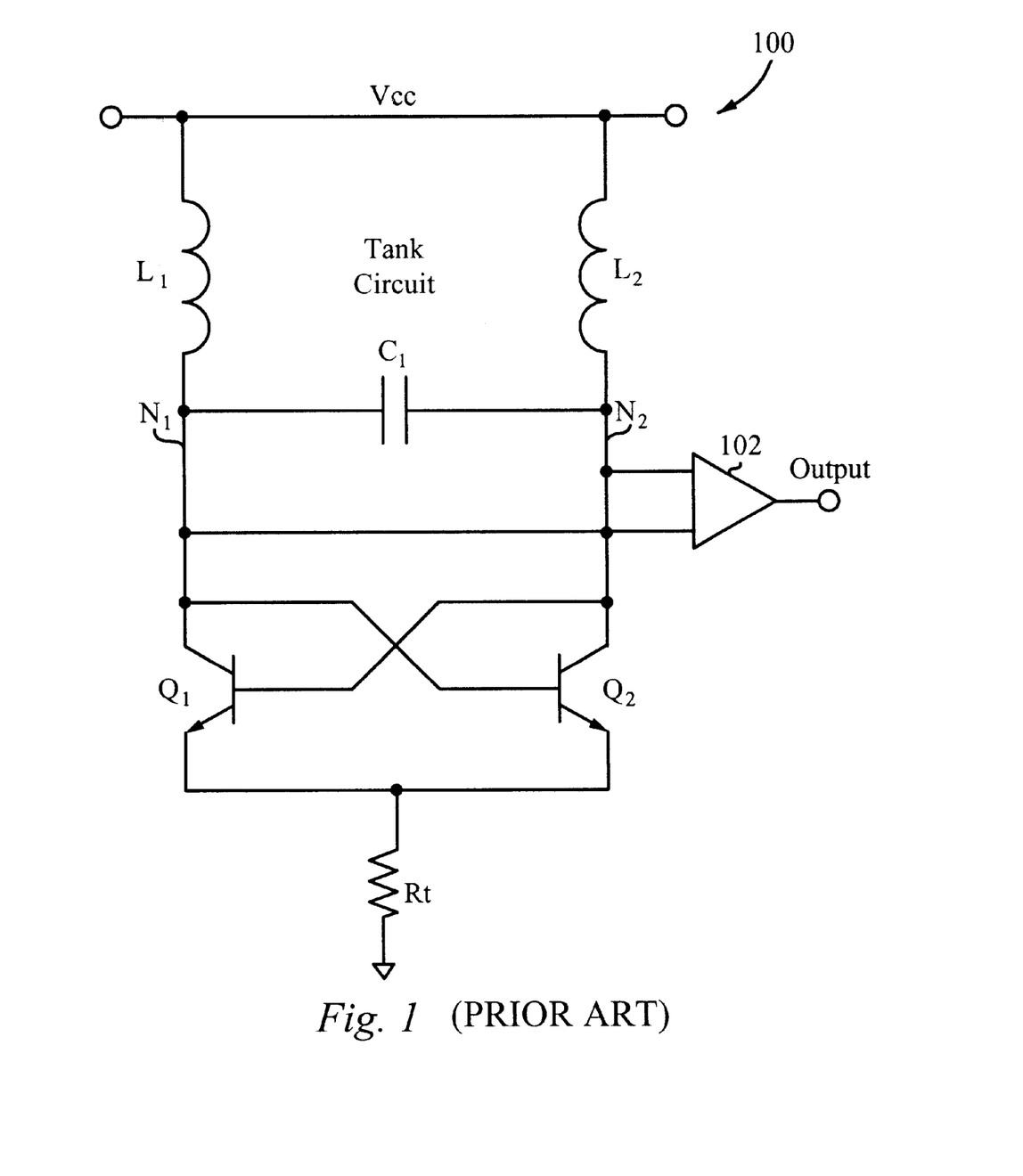
FIG. 1 illustrates an oscillator circuit of the prior art including a cross-coupled pair of transistors.

FIG. 1 illustrates a resonant tank circuit 100 of the prior art. More particularly, the tank circuit 100 includes inductors $L_1$ and $L_2$, each having a first terminal coupled to a supply voltage $V_{CC}$. A second terminal of the inductor $L_1$ forms a node $N_1$ which is coupled to a first terminal of a capacitor $C_1$, to a collector of a transistor $Q_1$ and to a base of a transistor $Q_2$. A second terminal of the inductor $L_2$ forms a node $N_2$ which is coupled to a second terminal of the capacitor $C_1$ and to a collector of the transistor $Q_2$ and to a base of the transistor $Q_1$. Emitters of the transistors $Q_1$ and $Q_2$ are coupled together and to a first terminal of a resistor $R_t$. A second terminal of the resistor $R_t$ is coupled to a ground node. An output from the tank circuit 100 is taken across the capacitor $C_1$ and supplied to a buffer circuit 102.

In operation, a voltage signal formed across the capacitor $C_1$ is generally a sinusoid which oscillates at the resonant frequency of the tank circuit 100. When the node $N_1$ is at a higher voltage level than the level of the node $N_2$, the transistor $Q_2$ has a higher bias voltage than the transistor $Q_1$. Accordingly, nearly all of the current through the resistor $R_t$ passes through the right side of the tank circuit 100 (through the inductor $L_2$ and the transistor $Q_2$). This tends to reinforce the voltage at the node $N_1$ being higher than the voltage at the node $N_2$. Accordingly, this results in positive feedback in the tank circuit 100.

Eventually, however, because there is little or no current passing through the inductor $L_1$ and the transistor $Q_1$, the voltage at the node $N_2$ tends to rise relative to the level at the node $N_1$. In response, the bias on the transistor $Q_1$ increases while the bias on the transistor $Q_2$ decreases. This reduces the current in the right side of the tank circuit 100 and increases the current in the left side (through the inductor $L_1$ and the transistor $Q_1$). Eventually, nearly all of the current through the resistor $R_t$ passes through the left side which reinforces the voltage at the node $N_2$ being higher than the voltage at the node $N_1$, through positive feedback.

Because there is little or no current passing through the right side of the tank circuit 100, the voltage at the node $N_1$ tends to rise relative to the level at the node $N_2$. In response, the bias on the transistor $Q_2$ increases while the bias on the transistor $Q_1$ decreases. Accordingly, the above-described cycle repeats. In this manner, current is alternately steered through the right and left sides of the tank circuit 100, thereby forming a sinusoidal signal across the capacitor $C_1$.

The conventional oscillator circuit illustrated in FIG. 1 has the drawback in that it has a gain peak which is relatively distant from the zero phase crossing, which can result in frequency drift during settling. The amplifier section of the oscillator formed by $Q_1$, $Q_2$ and $R_t$ has a relatively high capacitive output susceptance (low output capacitive impedance) which reduces tuning range. In addition, the tank circuit 100 requires the buffer circuit 102 which can increase phase noise by loading the tank circuit 100.

Therefore, what is needed is an improved oscillator circuit which does not suffer from the drawbacks exhibited by the prior art oscillator circuit of FIG. 1.

In addition, so that a carrier signal used for transmitting signals in a wireless communication system is appropriately modulated or demodulated, it is important that the nominal center frequency of a VCO used in the system be equivalent to the center frequency of the frequency band covered. The center frequency, however, will generally be affected by process variations which affect the values of the various components of the VCO. Accordingly, the VCO must generally be tunable to compensate for these process variations.

Accordingly, what is needed is an improved technique for tuning a VCO.

An integrated VCO is a VCO which is formed as a portion of an integrated circuit, rather than with discrete components. Because the reactive elements of an integrated VCO are not as accessible as those of a VCO which is formed of discrete components, this creates a difficulty in tuning an integrated VCO.

Therefore, what is further needed is an improved technique for tuning an integrated VCO.

SUMMARY OF THE INVENTION

The invention is a fuse-trimmed tank circuit for an integrated voltage-controlled oscillator (VCO). An improved oscillator circuit in accordance with the present invention includes an L-C portion; a cross-coupled pair of transistors, whose collectors are coupled to the L-C portion; a capacitor coupled across the emitters of the cross-coupled pair of transistors; and a pair of resistors, where each resistor is coupled between a corresponding one of the emitters and a ground node.

The capacitor coupled across the emitters of the cross-coupled pair of transistors counteracts the effects of phase lag caused by the transistors. Accordingly, this oscillator circuit arrangement provides improved performance in that it results in a high small-signal loop gain which provides reliable start-up; has a peak gain which is closer to a zero phase crossing than prior tank circuits, which reduces frequency drift during settling; and has a low capacitive output susceptance. Also, a periodic output signal formed by the VCO can be taken at the emitters of the cross-coupled pair, which avoids having to utilize a buffer which could increase phase noise.

The present invention also provides a technique for trimming the VCO so as to adjust its center frequency. Capacitance for the L-C portion of the tank circuit is provided by one or more varactor diodes. When the VCO is operational, the varactors are under reverse bias conditions. Accordingly, the varactors act as capacitive elements. One or more of the varactors has an associated fuse coupled in series with the corresponding varactor. To trim the center frequency of the VCO, the capacitance of the L-C portion is adjusted by selectively blowing the fuses. This reduces the capacitance of the L-C portion by an amount equivalent to the capacitance of the varactors associated with the blown fuses.

Under normal operating conditions, currents through the fuses are sufficiently low so as to avoid blowing any of the fuses. To blow a fuse, however, a dc voltage is applied to forward bias the corresponding varactor such that the resulting current is sufficiently high to blow the fuse. In the preferred embodiment, the varactors are arranged in pairs, where each varactor of the pair contributes to the capacitance of one or the other sides of the tank circuit for maintaining its symmetrical and differential nature. Preferably, the cathodes of each pair of varactors are coupled together and to a corresponding switch. The dc voltage is selectively applied to the pair of diodes via the corresponding switch. Accordingly, the two fuses associated with each varactor of the pair are blown together.

In the preferred embodiment, the VCO is fully integrated into an integrated circuit. Accordingly, the present invention has the advantage of not requiring elements external to the integrated circuit for trimming the VCO.

DETAILED DESCRIPTION OF THE PREFERRED EMBODIMENT

Figure 2:
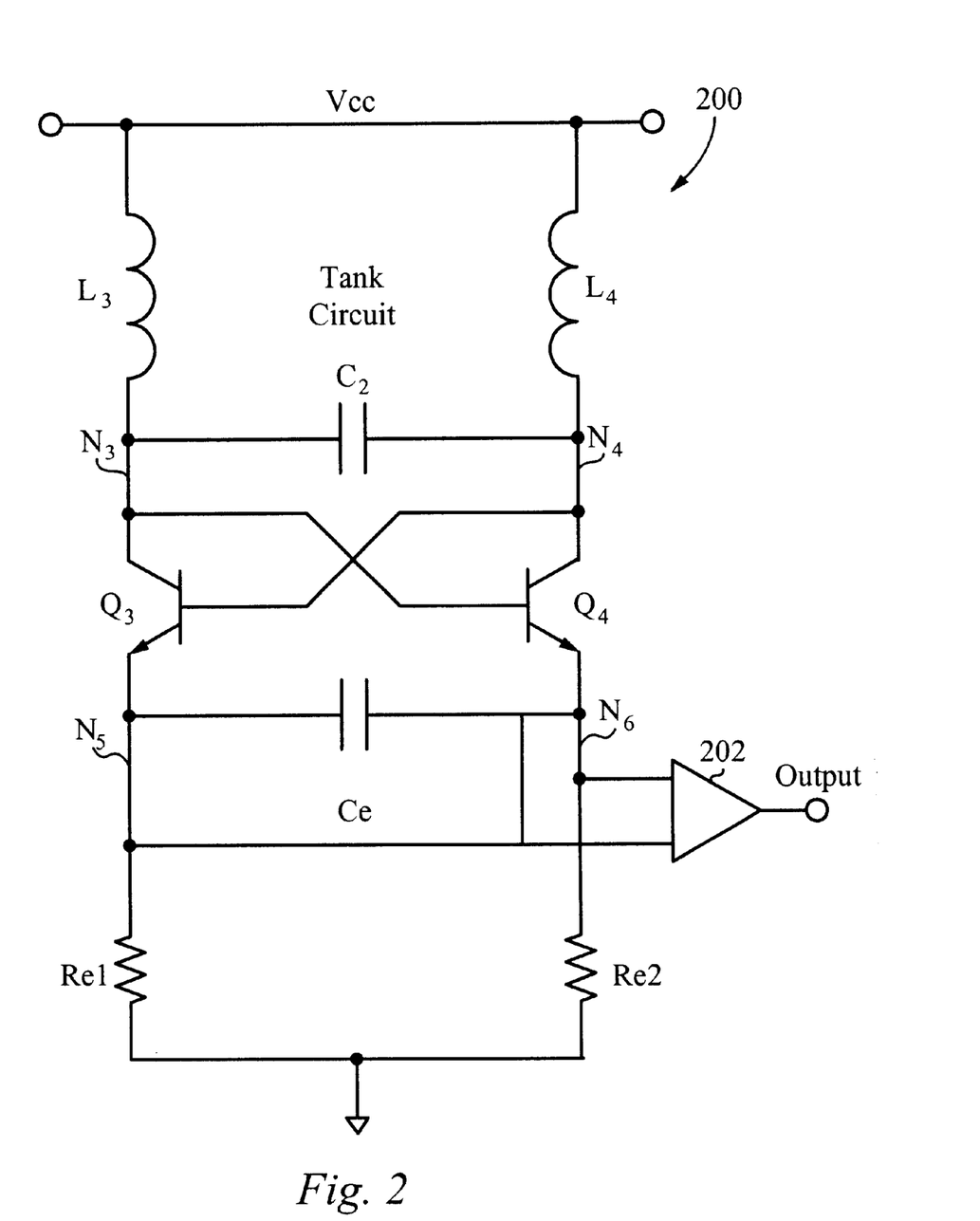
FIG. 2 illustrates an oscillator circuit in accordance with the present invention including a cross-coupled pair of transistors.

FIG. 2 illustrates a tank circuit 200 in accordance with the present invention including a cross-coupled pair of transistors $Q_3$ and $Q_4$. The tank circuit 200 also includes inductors $L_3$ and $L_4$ each having a first terminal coupled to a supply voltage $V_{CC}$. A second terminal of the inductor $L_3$ forms a node $N_3$ which is coupled to a first terminal of a capacitor $C_2$, to a collector of the transistor $Q_3$ and to a base (control terminal) of the transistor $Q_4$. A second terminal of the inductor $L_4$ forms a node $N_4$ which is coupled to a second terminal of the capacitor $C_2$ and to a collector of the transistor $Q_4$ and to a base (control terminal) of the transistor $Q_3$.

An emitter (output terminal) of the transistor $Q_3$ forms a node $N_5$ and is coupled to a first terminal of a capacitor $C_e$ and to a first terminal of a resistor $R_{e1}$. An emitter (output terminal) of the transistor $Q_4$ forms a node $N_6$ and is coupled to a second terminal of the capacitor $C_e$ and to first terminal of a resistor $R_{e2}$. A second terminal of the resistor $R_{e1}$ and a second terminal of the resistor $R_{e2}$ are each coupled to a ground node. An output from the tank circuit 200 is taken across the capacitor $C_e$. This contrasts with the conventional tank circuit 100 illustrated in FIG. 1 where the output must be taken at the collectors of the cross-coupled pair of transistors $Q_1$ and $Q_2$. However, if desired, the output periodic signal formed by the present invention can be taken across the capacitor $C_2$, at the nodes $N_3$ and $N_4$. Though the output need not be buffered, a buffer 202 can be utilized, either as shown in FIG. 2 with its inputs coupled across the capacitor $C_e$ or, if desired, the buffer 202 can be arranged such that its inputs are coupled across the nodes $N_3$ and $N_4$.

In operation, a voltage signal formed across the capacitor $C_2$ is generally a sinusoid which oscillates at the resonant frequency of the tank circuit 200. When the node $N_3$ is at a higher voltage level than the level of the node $N_4$, the transistor $Q_4$ has a higher bias voltage than the transistor $Q_3$. Accordingly, nearly all of the current drawn by the tank circuit 200 passes through the right side of the tank circuit 200 (through the inductor $L_4$, the transistor $Q_4$ and the resistor $R_{e2}$). This tends to reinforce the voltage at the node $N_3$ being higher than the voltage at the node $N_4$. Accordingly, this results in positive feedback in the tank circuit 200.

Eventually, however, because there is little or no current passing through the inductor $L_3$ and the transistor $Q_3$, the voltage at the node $N_4$ tends to rise relative to the level at the node $N_3$. In response, the bias on the transistor $Q_3$ increases while the bias on the transistor $Q_4$ decreases. This reduces the current in the right side of the tank circuit 200 and increases the current in the left side (through the inductor $L_3$, the transistor $Q_3$ and the resistor $R_{e1}$). Eventually, nearly all of the current drawn by passes through the left side which reinforces the voltage at the node $N_4$ being higher than the voltage at the node $N_3$, through positive feedback.

Because these is little or no current passing through the right side of the tank circuit 100, the voltage at the node $N_3$ tends to rise relative to the level at the node $N_4$. In response, the bias on the transistor $Q_4$ increases while the bias on the transistor $Q_3$ decreases. Accordingly, the above-described cycle repeats. In this manner, current is alternately steered through the right and left sides of the tank circuit 200 thereby forming a sinusoidal signal across the capacitor $C_2$. In addition, a sinusoidal signal is formed across the capacitor $C_e$. For this reason, the output periodic signal can be taken across either the capacitor $C_2$ or $C_e$. The amplitude of the signal formed across the capacitor $C_e$, however, may be smaller than the amplitude of the signal formed across the capacitor $C_2$.

There are important differences between the tank circuit 200 of FIG. 2 and the prior art tank circuit 100 illustrated in FIG. 1. In particular, the cross-coupled transistors $Q_1$ and $Q_2$ of the prior art tank circuit 100 introduce phase lag which varies according to the amplitude of the periodic signal. The capacitor $C_e$ of the tank circuit 200 in accordance with the present invention introduces a phase lead which tends to counteract phase lag introduced by the transistors $Q_3$ and $Q_4$ and, thus, improves the performance of the tank circuit 200. In particular, this tank circuit 200 arrangement results in a higher small-signal loop gain at the zero phase crossing which provides reliable start-up; has a peak gain which is closer to a zero phase crossing than the prior art tank circuit 100, which reduces frequency drift during settling; and has a low output susceptance. In the preferred embodiment, the value of the capacitor $C_e$ is selected such that the phase lead introduced by the capacitor $C_e$ cancels the phase lag introduced by the cross-coupled transistors $Q_3$ and $Q_4$ at the desired resonant frequency (e.g., the desired center frequency for the VCO).

Figure 3:
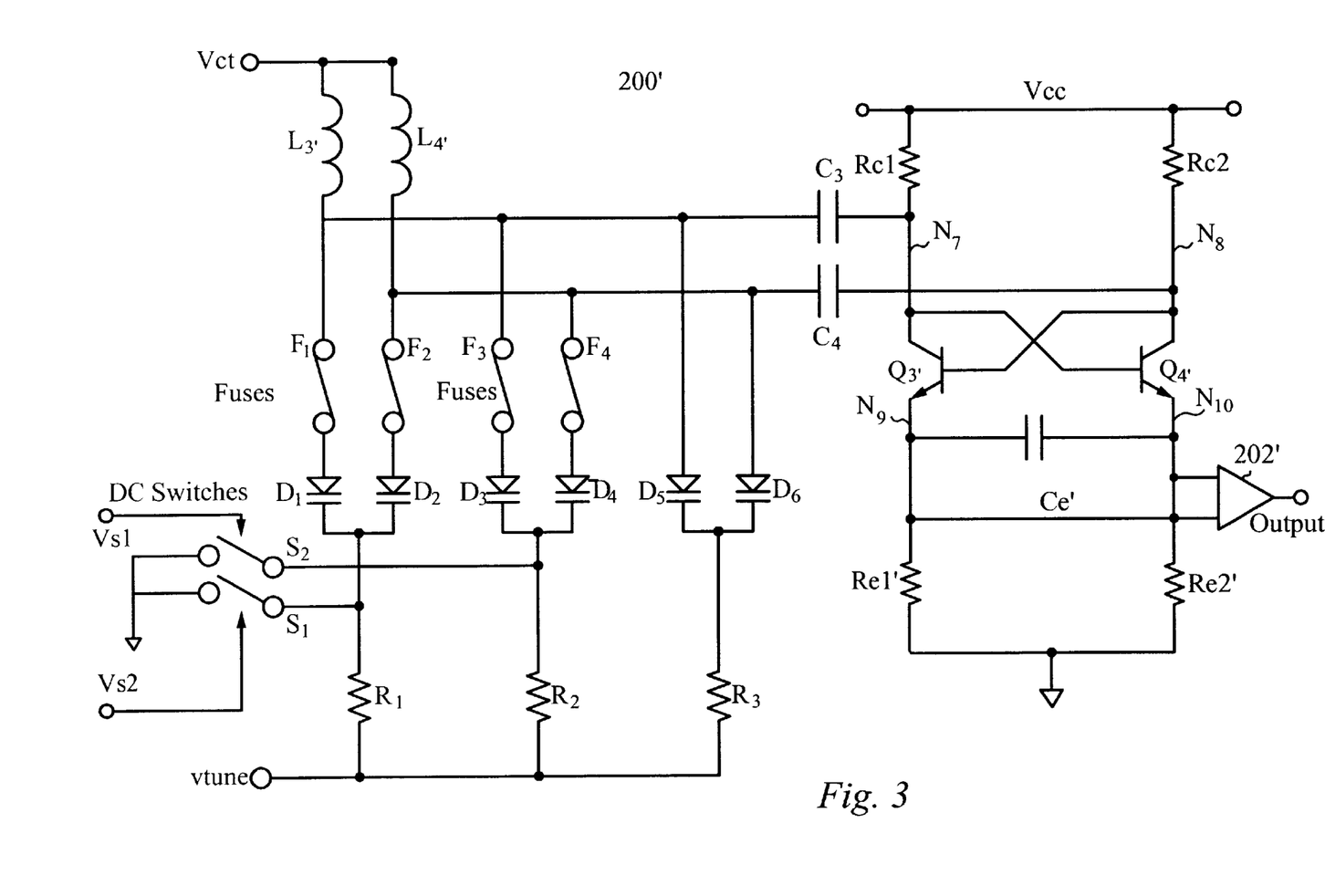
FIG. 3 illustrates a voltage-controlled oscillator including a fuse-trimmed tank circuit in accordance with the present invention.

FIG. 3 illustrates a voltage-controlled oscillator (VCO) including a fuse-trimmed tank circuit 200' in accordance with the present invention. Elements of the VCO illustrated in FIG. 3 having a one-to-one functional correspondence with those of the tank circuit 200 illustrated in FIG. 2 are identified by the same reference character primed. A trimming control voltage source $V_{ct}$ is coupled to a first terminal of an inductor $L_3'$ and to a first terminal of an inductor $L_4'$. A second terminal of the inductor $L_3'$ is coupled to a first terminal of a fuse $F_1$, to a first terminal of a fuse $F_3$, to a first terminal of a capacitor $C_3$ and to an anode of a varactor diode $D_5$. A second terminal of the inductor $L_4'$ is coupled to a first terminal of a fuse $F_2$, to a first terminal of a fuse $F_4$, to a first terminal of a capacitor $C_4$ and to an anode of a varactor diode $D_6$.

A second terminal of the fuse $F_1$ is coupled to an anode of a varactor diode $D_1$. A second terminal of the fuse $F_2$ is coupled to an anode of a varactor diode $D_2$. A cathode of the varactor $D_1$ is coupled to a cathode of the varactor $D_2$, to a first terminal of a switch $S_1$ and to a first terminal of a resistor $R_1$. A second terminal of the fuse $F_3$ is coupled to an anode of a varactor diode $D_3$. A second terminal of the fuse $F_4$ is coupled to an anode of a varactor diode $D_4$. A cathode of the varactor $D_3$ is coupled to a cathode of the varactor $D_4$, to a first terminal of a switch $S_2$ and to a first terminal of a resistor $R_2$. A second terminal of the switch $S_1$ and a second terminal of the switch $S_2$ are coupled to a ground node. A first switch control voltage $V_{s1}$ is coupled to the switch $S_1$ to control its condition (opened or closed). A second switch control voltage $V_{s1}$ is coupled to the switch $S_2$ to control its condition (opened or closed).

A cathode of the varactor $D_5$ and a cathode of the varactor $D_6$ are coupled to a first terminal of a resistor $R_3$. A second terminal of the resistor $R_1$, a second terminal of the resistor $R_2$, and a second terminal of the resistor $R_3$ are each coupled to receive a tuning control voltage $V_{tune}$.

A second terminal of the capacitor $C_3$ forms a node $N_7$ and is coupled to a first terminal of a resistor $R_{c1}$, to a collector of a transistor $Q_3'$ and to a base of a transistor $Q_4'$. A second terminal of the capacitor $C_4$ forms a node $N_8$ and is coupled to a first terminal of a resistor $R_{c2}$ to a collector of the transistor $Q_4'$ and to a base of the transistor $Q_3'$. A second terminal of the resistor $R_{c1}$ and a second terminal of the resistor $R_{c2}$ are each coupled to a supply node $V_{CC}$.

An emitter of the transistor $Q_3'$ forms a node $N_9$ and is coupled to a first terminal of a capacitor $C_e'$ and to a first terminal of a resistor $R_{e1}'$. An emitter of the transistor $Q_4'$ forms a node $N_{10}$ and is coupled to a second terminal of the capacitor $C_e'$ and to first terminal of a resistor $R_{e2}'$. A second terminal of the resistor $R_{e1}'$ and a second terminal of the resistor $R_{e2}'$ are each coupled to a ground node.

An output from the VCO is taken across the capacitor $C_e'$. Though the output need not be buffered, a buffer 202' can be utilized. In which case, a first input terminal of the buffer 202' is coupled to the node $N_9$ and a second input terminal of the buffer 202' is coupled to the node $N_{10}$. In addition, the output periodic signal can be taken across the nodes $N_7$ and $N_8$. In which case, if a buffer is desired, the inputs of the buffer 202' can be coupled across the nodes $N_7$ and $N_8$.

An L-C portion of the tank circuit 200' includes the inductors $L_3'$ and $L_4'$ and the capacitors $C_3$ and $C_4$. The varactors $D_5$–$D_6$ and, depending upon results of a trimming operation described herein, possibly selected ones of the varactors $D_1$–$D_4$ contribute additional capacitance to the L-C portion. An arrangement of circuit elements for trimming the tank circuit 200' includes the fuses $F_1$–$F_4$ and the varactor diodes $D_1$–$D_4$. In the preferred embodiment, the trimming operation only removes capacitance from the tank circuit 200', and does not add capacitance to the tank circuit 200'. Accordingly, the trimming operation preferably increases, rather than decreases, the center frequency of the VCO. Therefore, an initial capacitance before trimming is preferably provided so as to ensure that, under worst case process variations, the center frequency before trimming is lower than, or equal to, the desired center frequency.

As illustrated in FIG. 3, the varactors $D_1$–$D_4$ are preferably arranged in pairs (as are the varactors $D_5$–$D_6$). The capacitance of the varactors of each pair are preferably substantially equal as each contributes to the capacitance of one or the other sides of the tank circuit 200'. Thus, the capacitance provided by the varactor $D_1$ is preferably substantially equal to the capacitance provided by the varactor $D_2$. In addition, the capacitance provided by the varactor $D_3$ is preferably substantially equal to the capacitance provided by the varactor $D_4$. Preferably, when a varactor is removed from tank circuit 200' by trimming, the other varactor of the pair is removed as well. Accordingly, the symmetrical and differential nature of the tank circuit 200' is maintained.

However, the capacitance provided by each of the varactors $D_1$ and $D_2$ preferably differs from that provided by the each of the varactors $D_3$ and $D_4$ by a factor of two. Accordingly, by providing two binary-weighted sets of varactors ($D_1$, $D_2$) and ($D_3$, $D_4$) which can be removed from the tank circuit 200', four different and substantially equally-spaced levels of capacitance are available for trimming the tank circuit 200'. It will be apparent that one or more additional sets of binary-weighted varactors can be provided so as to have eight, sixteen, or more, substantially equally-spaced values of capacitance available for trimming the tank circuit 200'. Each available value of capacitance corresponds to a frequency of oscillation for the tank circuit 200'. It will also be apparent, however, that each varactor can provide the same capacitance value (i.e., the values are not weighted).

The VCO tank circuit 200' is trimmed in the following manner. The tuning control voltage $V_{tune}$ is set to a nominal level at which the VCO is to operate at its center frequency. It will be apparent that the nominal level for the tuning control voltage $V_{tune}$ will be related to a variety of factors, including the values of the various components of the VCO and the characteristics of the varactors $D_1$–$D_6$. In addition, the trimming control voltage $V_{ct}$ is set to a nominal level for normal operation of the VCO. The nominal level for the trimming control voltage $V_{ct}$ is preferably selected as ground level.

Then, a resulting frequency is measured across the capacitor $C_e'$. Alternately, the resulting frequency is measured at the output of the buffer 202' or across the nodes $N_7$ and $N_8$. Assuming the resulting frequency is lower than desired, pairs of the fuses ($F_1$, $F_2$) or ($F_3$, $F_4$) are selected to be blown so as to raise the frequency of oscillation to be closer to the desired frequency. The determination of which pair of fuses ($F_1$, $F_2$) or ($F_3$, $F_4$) are to be blown is based upon the difference between the measured frequency and the desired frequency and upon the binary-weights of the capacitance values provided by the corresponding pairs of varactors ($D_1$, $D_2$) and ($D_3$, $D_4$). In other words, based upon the measured frequency, the resulting frequency for each possible combination of the binary-weighted pairs of varactors can be estimated through calculations. The combination which results in an actual frequency of oscillation which is closest to the desired center frequency is selected.

Once the appropriate pairs of fuses ($F_1$, $F_2$) or ($F_3$, $F_4$) to be blown are identified, the switches $S_1$ and $S_2$ are appropriately conditioned to provide a conductive path from the trimming control voltage $V_{ct}$ to the ground node through the fuses to be blown or to provide an open circuit, thereby blocking any such current path containing a fuse which is not to be blown. For example, assume the fuses $F_1$ and $F_2$ are to be blown during the trimming operation, but the fuses $F_3$ and $F_4$ are not. In which case, the switch $S_1$ is closed and the switch $S_2$ is opened.

Then, the level of the trimming control voltage $V_{ct}$ is raised sufficiently to cause a resulting current which flows through the selected fuses to blow the fuses. Because the blown fuse are effectively open circuited, the capacitance of the corresponding varactors are effectively removed from the tank circuit 200'. Thus, in the example, current induced by the trimming control voltage $V_{ct}$ flows through the fuses $F_1$ and $F_2$, causing them to become blown. Accordingly, in the example, the capacitance of the varactors $D_1$ and $D_2$ will no longer affect the frequency of oscillation once the fuses $F_1$ and $F_2$ are blown.

As described above, the trimming process can include a single frequency measurement step and a single fuse blowing step. Alternately, the trimming process can be iterative, in which case, after selected fuses are blown, one or more additional frequency measurement and fuse blowing steps can be performed so as to more closely approach the desired frequency of oscillation. Preferably, if the trimming process is iterative, then fuses are first blown which are associated with varactors having a capacitance values assigned higher binary weights (i.e. blowing such fuses results in a greater change in frequency), and fuses are later blown which are associated with varactors having a lower binary-weighted values (i.e. blowing such fuses results in smaller frequency changes). Additionally, when the trimming process is iterative, that is the only instance in which the varactors are un-weighted.

For normal operation of the preferred embodiment of the VCO, the trimming control voltage $V_{ct}$ is set to ground level and the switches $S_1$ and $S_2$ are opened. The tuning control voltage $V_{tune}$ is then set to its nominal level for oscillation at the center frequency. Because the capacitance values of the remaining ones of the varactors $D_1$–$D_4$ and the varactors $D_5$–$D_6$ are dependent upon their reverse bias voltages, adjustment of the tuning control voltage $V_{tune}$ higher or lower adjusts the oscillation frequency of the VCO. For example, a content-carrying signal can be transmitted via a carrier signal according to frequency modulation techniques by applying the content-carrying signal as the tuning control voltage $V_{tune}$ and, then, transmitting a modulated output signal obtained across the capacitor $C_e'$ or across the nodes $N_7$ and $N_8$.

The present invention has been described in terms of specific embodiments incorporating details to facilitate the understanding of the principles of construction and operation of the invention. Such reference herein to specific embodiments and details thereof is not intended to limit the scope of the claims appended hereto. It will be apparent to those skilled in the art that modifications may be made in the embodiment chosen for illustration without departing from the spirit and scope of the invention. Specifically, it will be apparent to one of ordinary skill in the art that the device of the present invention could be implemented in several different ways and the apparatus disclosed above is only illustrative of the preferred embodiment of the invention and is in no way a limitation. For example, it would be within the scope of the invention to vary the values of the various components, current levels, and voltage levels disclosed herein. Further, it would be within the scope of the invention to substitute another type of transistor, such as a field effect transistor, for any of the transistors disclosed herein. In addition, though the preferred tank circuit is formed as portion of an integrated circuit, it will be apparent that the tank circuit and VCO can include one or more discrete components.

What is claimed is:

1. A tank circuit for a voltage-controlled oscillator wherein the tank circuit comprises:
   a. an L-C portion having a first capacitor;
   b. a pair of transistors whose control terminals are coupled to the L-C portion;
   c. a second capacitor coupled across output terminals of the pair of transistors; and
   d. a pair of resistors, wherein each resistor is coupled between a corresponding one of the output terminals of the pair of transistors and a ground node.

2. The tank circuit according to claim 1 wherein the pair of transistors are a cross-coupled pair of transistors.

3. The tank circuit according to claim 1 wherein a periodic signal is formed across the second capacitor.

4. The tank circuit according to claim 3 wherein the periodic signal is substantially sinusoidal.

5. The tank circuit according to claim 1 wherein the L-C portion comprises a pair of inductors wherein the first capacitor is coupled to the pair of inductors.

6. The tank circuit according to claim 1 wherein a periodic signal is formed across the control terminals of the cross-coupled pair of transistors.

7. The tank circuit according to claim 6 wherein the periodic signal is substantially a sinusoid.

8. The tank circuit according to claim 1 further comprising a first varactor selectively coupled to the L-C portion for providing a variable capacitance value to the tank circuit.

9. The tank circuit according to claim 8 wherein the first varactor is selectively coupled to the L-C portion via a fuse.

10. The tank circuit according to claim 9 wherein an oscillation frequency of the tank circuit is controlled by applying a reverse bias voltage of variable magnitude to the first varactor.

11. The tank circuit according to claim 9 further comprising a second varactor coupled to the L-C portion wherein an oscillation frequency of the tank circuit is controlled by applying a reverse bias voltage of variable magnitude to the second varactor.

12. The tank circuit according to claim 1 further comprising a plurality of pairs of varactors removably coupled to the L-C portion for providing a variable capacitance value to the tank circuit.

13. The tank circuit according to claim 12 wherein each pair of varactors are removably coupled to the L-C portion via a corresponding pair of fuses.

14. The tank circuit according to claim 13 wherein each pair of varactors are removed by blowing both fuses of the corresponding pair of fuses.

15. The tank circuit according to claim 13 wherein an oscillation frequency of the tank circuit is controlled by applying a reverse bias voltage of variable magnitude to the plurality of pairs of varactors.

16. A tank circuit for a voltage-controlled oscillator wherein the tank circuit comprises:
   a. an L-C portion having a first capacitor;
   b. a cross-coupled pair of transistors whose control terminals are coupled to the L-C portion;
   c. a second capacitor coupled across output terminals of the cross-coupled pair of transistors; and
   d. a pair of resistors, wherein each resistor is coupled between a corresponding one of the output terminals of the cross-coupled pair of transistors and a ground node.

17. The tank circuit according to claim 16 wherein the cross-coupled pair of transistors includes a pair of cross-coupled bipolar transistors.

18. The tank circuit according to claim 17 wherein a periodic signal is formed across the second capacitor.

19. The tank circuit according to claim 18 wherein the periodic signal is substantially sinusoidal.

20. The tank circuit according to claim 17 wherein the L-C portion comprises a pair of inductors wherein the first capacitor is coupled to the pair of inductors.

21. The tank circuit according to claim 17 wherein a periodic signal is formed across the control terminals of the cross-coupled pair of transistors.

22. The tank circuit according to claim 21 wherein the periodic signal is substantially a sinusoid.

23. The tank circuit according to claim 17 further comprising a first varactor selectively coupled to the L-C portion for providing a variable capacitance value to the tank circuit.

24. The tank circuit according to claim 23 wherein the first varactor is selectively coupled to the L-C portion via a fuse.

25. The tank circuit according to claim 24 wherein an oscillation frequency of the tank circuit is controlled by applying a reverse bias voltage of variable magnitude to the first varactor.

26. The tank circuit according to claim 24 further comprising a second varactor coupled to the L-C portion wherein an oscillation frequency of the tank circuit is controlled by applying a reverse bias voltage of variable magnitude to the second varactor.

27. The tank circuit according to claim 17 further comprising a plurality of pairs of varactors removably coupled to the L-C portion for providing a variable capacitance value to the tank circuit.

28. The tank circuit according to claim 27 wherein each pair of varactors are removably coupled to the L-C portion via a corresponding pair of fuses.

29. The tank circuit according to claim 28 wherein each pair of varactors are removed by blowing both fuses of the corresponding pair of fuses.

30. The tank circuit according to claim 28 wherein an oscillation frequency of the tank circuit is controlled by applying a reverse bias voltage of variable magnitude to the plurality of pairs of varactors.

31. A tank circuit for a voltage-controlled oscillator wherein the tank circuit comprises:
   1. an L-C portion; and
   2. a first varactor removably coupled to the L-C portion for providing a variable capacitance value to the tank circuit,
   wherein the first varactor is removably coupled to the L-C portion via a fuse.

32. The tank circuit according to claim 31 further comprising a second varactor coupled to the L-C portion wherein an oscillation frequency of the tank circuit is controlled by applying a reverse bias voltage of variable magnitude to the second varactor.

33. The tank circuit according to claim 31 wherein an oscillation frequency of the tank circuit is controlled by applying a reverse bias voltage of variable magnitude to the first varactor.

34. A tank circuit for a voltage-controlled oscillator wherein the tank circuit comprises:
   1. an L-C portion; and
   2. a plurality of pairs of varactors removably coupled to the L-C portion for providing a variable capacitance value to the tank circuit,
   wherein each pair of varactors are removably coupled to the L-C portion via a corresponding pair of fuses.

35. The tank circuit according to claim 34 wherein an oscillation frequency of the tank circuit is controlled by applying a reverse bias voltage of variable magnitude to the plurality of pairs of varactors.

36. The tank circuit according to claim 34 wherein each pair of varactors are removed by blowing both fuses of the corresponding pair of fuses.

37. The tank circuit according to claim 36 further comprising a switch associated with the pair of fuses to be blown wherein a current through the switch blows each fuse of the pair.

38. A method of tuning a voltage-controlled oscillator wherein the method comprises steps of:
   a. providing a capacitive element for a tank circuit wherein the capacitive element includes a varactor;
   b. providing a fuse coupled in series with the varactor; and
   c. adjusting a value of the capacitive element by selectively blowing the fuse.

39. A method of tuning a voltage-controlled oscillator wherein the method comprises steps of:
   a. providing a capacitive element for a tank circuit wherein the capacitive element includes a first pair of varactors;
   b. providing a fuse coupled in series with each varactor of the first pair of varactors; and
   c. adjusting a value of the capacitive element by selectively blowing the fuses associated with the first pair of varactors.

40. The method according to claim 39 wherein the first pair of varactors have a common cathode.

41. The method according to claim 39 further comprising steps of:
   a. providing a second pair of varactors included in the capacitive element;
   b. providing a fuse coupled in series with each varactor of the additional pair;
   and
   c. adjusting a value of the capacitive element by selectively blowing the fuses associated with the additional pair of varactors.

42. The method according to claim 41 wherein the first and second pair of varactors have values selected according to a binary weighting scheme.

43. The method according to claim 41 wherein the first and second pair of varactors have different capacitive values and further comprising steps of:
   a. measuring an oscillation frequency of the voltage-controlled oscillator; and
   b. determining which of the first and second pairs of varactors should be blown during the step of adjusting by performing a calculation which takes into account the oscillation frequency measured during the step of measuring and which takes into account a desired oscillation frequency.

44. The method according to claim 43 wherein the steps of measuring and determining and performed iteratively.

45. A tank circuit for a voltage-controlled oscillator wherein the tank circuit comprises:
   a. a first inductor having a first terminal and a second terminal;
   b. a second inductor having a first terminal and a second terminal wherein a first terminal of the first inductor is coupled to a first terminal of the second inductor;

c. a first capacitor having a first terminal and a second terminal wherein the first terminal of the first capacitor is coupled to the second terminal of the first inductor;

d. a second capacitor having a first terminal and a second terminal wherein the first terminal of the second capacitor is coupled to the second terminal of the second inductor;

e. a first varactor having an anode and a cathode wherein the anode of the first varactor is coupled to the second terminal of the first inductor via a first fuse;

f. a second varactor having an anode and a cathode wherein the anode of the second varactor is coupled to the second terminal of the second inductor via a second fuse; and g. a cross-coupled pair of transistors coupled to the second terminal of the first capacitor and to the second terminal of the second capacitor.

46. The tank circuit according to claim 45 wherein the first and second varactors comprise a first pair of varactors and the tank circuit further comprising one or more additional pairs of varactors for providing capacitance to the tank circuit.

47. The tank circuit according to claim 46 wherein an oscillation frequency of the tank circuit is controlled by applying a reverse bias voltage of variable magnitude to the pairs of varactors.

48. The tank circuit according to claim 46 wherein at least one pair of the additional pairs of varactors are coupled to the tank circuit via a corresponding pair of fuses.

49. The tank circuit according to claim 48 wherein selected pairs of varactors are removed by blowing both fuses of the corresponding pair of fuses.

50. The tank circuit according to claim 49 further comprising a switch associated with the pair of fuses to be blown wherein a current through the switch blows each fuse of the pair.

* * * * *

UNITED STATES PATENT AND TRADEMARK OFFICE
CERTIFICATE OF CORRECTION

PATENT NO.      : 6,445,257 B1                                                    Page 1 of 1
DATED           : September 3, 2002
INVENTOR(S)     : Robert Cox et al.

It is certified that error appears in the above-identified patent and that said Letters Patent is hereby corrected as shown below:

<u>Title page,</u>
Item [56], U.S. PATENT DOCUMENTS, insert
-- 5,953,640      09/1999         Meador et al.    455/73 --.
Item [75], Inventors, delete "Little Abington" and insert -- Cambridge --; and delete "Great Shelford" and insert -- Cambridge --.

Signed and Sealed this

Twenty-fourth Day of December, 2002

JAMES E. ROGAN
*Director of the United States Patent and Trademark Office*